(12) United States Patent
Lee et al.

(10) Patent No.: US 9,324,736 B2
(45) Date of Patent: Apr. 26, 2016

(54) THIN FILM TRANSISTOR SUBSTRATE HAVING METAL OXIDE SEMICONDUCTOR AND MANUFACTURING THE SAME

(71) Applicant: LG DISPLAY CO., LTD., Seoul (KR)

(72) Inventors: Sungkeun Lee, Goyang-Si (KR); Yongtae Song, Paju-Si (KR); Imkuk Kang, Paju-Si (KR); Sungjun Yun, Ansan-Si (KR); Woocheol Jeong, Goyang-Si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/550,483

(22) Filed: Nov. 21, 2014

(65) Prior Publication Data
US 2015/0155310 A1 Jun. 4, 2015

(30) Foreign Application Priority Data
Dec. 2, 2013 (KR) .......................... 10-2013-0148531

(51) Int. Cl.
| | |
|---|---|
| H01L 27/12 | (2006.01) |
| H01L 29/786 | (2006.01) |
| H01L 29/45 | (2006.01) |
| H01L 29/66 | (2006.01) |
| H01L 29/417 | (2006.01) |

(52) U.S. Cl.
CPC ...... *H01L 27/1225* (2013.01); *H01L 29/41733* (2013.01); *H01L 29/45* (2013.01); *H01L 29/66969* (2013.01); *H01L 29/7869* (2013.01); *H01L 29/78696* (2013.01); *H01L 27/1288* (2013.01)

(58) Field of Classification Search
None
See application file for complete search history.

(56) References Cited

U.S. PATENT DOCUMENTS

| | | | | |
|---|---|---|---|---|
| 8,158,975 | B2 * | 4/2012 | Akimoto | 257/43 |
| 2012/0018720 | A1 * | 1/2012 | Park et al. | 257/43 |
| 2012/0025320 | A1 * | 2/2012 | Chen et al. | 257/369 |
| 2012/0187087 | A1 * | 7/2012 | Ohshiro et al. | 216/95 |

* cited by examiner

*Primary Examiner* — Matthew Reames
*Assistant Examiner* — Steven B Gauthier
(74) *Attorney, Agent, or Firm* — Birch, Stewart, Kolasch & Birch, LLP

(57) ABSTRACT

The present disclosure relates to a thin film transistor substrate having a metal oxide semiconductor for flat panel displays and a method for manufacturing the same. The present disclosure suggests a thin film transistor substrate including: a gate electrode on a substrate; a gate insulating layer covering the gate electrode; a source electrode overlapping with one side of the gate electrode on the gate insulating layer; a drain electrode being apart from the source electrode and overlapping with other side of the gate electrode on the gate insulating layer; an oxide semiconductor layer contacting an upper surface of the source electrode and the drain electrode, and extending from the source electrode to the drain electrode; and an etch stopper having the same shape with the oxide semiconductor layer, and contacting an upper surface of the oxide semiconductor layer.

5 Claims, 11 Drawing Sheets

THIN FILM TRANSISTOR SUBSTRATE HAVING METAL OXIDE SEMICONDUCTOR AND MANUFACTURING THE SAME

CROSS-REFERENCE TO RELATED APPLICATION

This application claims priority to Patent Application No. 10-2013-0148531 filed on Dec. 2, 2013 in Republic of Korea, which is incorporated by reference herein in its entirety.

BACKGROUND OF THE INVENTION

1. Field of the Invention

The present disclosure relates to a thin film transistor (TFT) substrate having a metal oxide semiconductor for flat panel displays and a method for manufacturing the same. Particularly, the present disclosure relates to a thin film transistor substrate and a manufacturing method the same for the flat panel display in which an oxide semiconductor material is formed after forming the source-drain electrode so that the channel area can be precisely defined.

2. Discussion of the Related Art

Nowadays, as the information society is developed, the requirements of displays for representing information are increasing. Accordingly, the various flat panel displays (FPDs) are developed for overcoming many drawbacks of the cathode ray tube (CRT) such as heavy weight and bulk volume. The flat panel display devices include the liquid crystal display device (LCD), the field emission display (FED), the plasma display panel (PDP), the organic light emitting display device (OLED) and the electrophoresis display device (ED).

The display panel of a flat panel display may include a thin film transistor substrate having a thin film transistor allocated in each pixel region arrayed in a matrix manner. For example, the liquid crystal display device represents video data by controlling the light transitivity of the liquid crystal layer using the electric fields. According to the direction of the electric field, the LCD can be classified in the two major types; one is vertical electric field type and the other is the horizontal electric field type.

For the vertical electric field type LCD, a common electrode formed on an upper substrate and a pixel electrode formed on a lower substrate are facing with each other for forming an electric field of which direction is perpendicular to the substrate face. A twisted nematic (TN) liquid crystal layer disposed between the upper substrate and the lower substrate is driven by the vertical electric field. The vertical electric field type LCD has merit of higher aperture ratio, while it has demerit of narrower view angle about 90 degree.

For the horizontal electric field type LCD, a common electrode and a pixel electrode are formed on the same substrate in parallel. A liquid crystal layer disposed between an upper substrate and a lower substrate is driven in In-Plane-Switching (IPS) mode by an electric field parallel to the substrate face. The horizontal electric field type LCD has a merit of wider view angle over 160 degrees and faster response speed than the vertical electric field type LCD. However, the horizontal electric field type LCD may have demerits such as low aperture ratio and transitivity ratio of the back light.

In the IPS mode LCD, for example, in order to form the in-plane electric field, the gap between the common electrode and the pixel electrode may be larger than the gap (or "Cell Gap") between the upper substrate and the lower substrate, and in order to get enough strength of the electric field, the common electrode and the pixel electrode may have a strip pattern having certain width. Between the pixel electrode and the common electrode of the IPS mode LCD, the electric field horizontal with the substrate is formed. However, just over the pixel electrode and the common electrode, there is no electric field. That is, the liquid crystal molecules disposed just over the pixel electrodes and the common electrodes are not driven but maintain the initial conditions (the initial alignment direction). As the liquid crystal molecules in the initial condition cannot control the light transitivity properly, the aperture ratio and the luminescence may be degraded.

For resolving these demerits of the IPS mode LCD, the fringe field switching (FFS) type LCD driven by the fringe electric field has been proposed. The FFS type LCD comprises the common electrode and the pixel electrode with the insulating layer there-between, and the gap between the pixel electrode and the common electrode is set narrower than the gap between the upper substrate and the lower substrate. So that, a fringe electric field having a parabola shape is formed in the space between the common electrode and the pixel electrode as well over these electrodes. Therefore, most of all liquid crystal molecules disposed between the upper substrate and the lower substrate can be driven by this fringe field. As a result, it is possible to enhance the aperture ratio and the front luminescence.

For the fringe field type liquid crystal display, the common electrode and the pixel electrode are disposed closely each other or in an overlapped manner, so that a storage is formed between the common electrode and the pixel electrode. Therefore, the fringe field type liquid crystal display has a merit in that there is no extra space for forming the storage in the pixel region. However, when a large area display is formed in a fringe field type, the pixel region would be getting larger and the storage would be getting larger and larger. In that case, the thin film transistor should have also larger size for driving/charging the enlarged storage in a short time period.

To address this problem, the thin film transistor having a metal oxide semiconductor material is applied because it has the high current control characteristics without enlarging the size of the thin film transistor. FIG. 1 is a plane view illustrating a thin film transistor substrate having an oxide semiconductor layer included in a fringe field type liquid crystal display according to the related art. FIG. 2 is a cross-sectional view illustrating the structure of the thin film transistor substrate of FIG. 1 by cutting along the line I-I' according to the related art.

The thin film transistor substrate having a metal oxide semiconductor layer shown in FIGS. 1 and 2 includes a gate line GL and a data line DL crossing each other with a gate insulating layer GI therebetween on a lower substrate SUB, and a thin film transistor T formed at each crossing portion. By the crossing structure of the gate line GL and the data line DL, a pixel region is defined.

The thin film transistor T includes a gate electrode G branched (or 'extruded') from the gate line GL, a source electrode S branched from the data line DL, a drain electrode D facing the source electrode S and connecting to the pixel electrode PXL, and a semiconductor layer A overlapping with the gate electrode G on the gate insulating layer GI for forming a channel between the source electrode S and the drain electrode D.

The semiconductor layer A made of the oxide semiconductor material has a merit for a large area thin film transistor substrate having a large charging capacitance, thanks to the high electron mobility of the oxide semiconductor layer. However, the thin film transistor having the oxide semiconductor material would have an etch stopper ES for protecting the upper surface of the semiconductor layer from the etching material for ensuring the stability and the characteristics of the thin film transistor. In more detail, it is proper to have an etch stopper ES for protecting the semiconductor layer A from the etchant used for forming the source electrode S and the drain electrode D there-between.

In the pixel region, a pixel electrode PXL and a common electrode COM are formed with the second passivation layer PA2 there-between, to form a fringe electric field. The common electrode COM is connected to the common line CL disposed in parallel with the gate line GL. The common electrode COM is supplied with a reference voltage (or "common voltage") via the common line CL.

The common electrode COM and the pixel electrode PXL can have various shapes and positions according to the design purpose and environment. While the common electrode COM is supplied with a reference voltage having constant value, the pixel electrode PXL is supplied with a data voltage varying timely according to the video data. Therefore, between the data line DL and the pixel electrode PXL, a parasitic capacitance may be formed. Due to the parasitic capacitance, the video quality of the display may be degraded. Therefore, it is preferable to form the common electrode COM at first and then the pixel electrode PXL is formed at the topmost layer.

In other words, on the first passivation layer PA1 covering the data line DL and the thin film transistor T, a planarization layer PAC formed by thickly depositing an organic material having a low permittivity. Then, the common electrode COM is formed. And then, after depositing the second passivation layer PA2 to cover the common electrode COM, the pixel electrode PXL overlapping with the common electrode is formed on the second passivation layer PA2. In this structure, the pixel electrode PXL is far from the data line DL by the first passivation layer PA1, the planarization layer PAC and the second passivation layer PA2, so that it is possible to reduce the parasitic capacitance between the data line DL and the pixel electrode PXL.

The common electrode COM is formed to a rectangular shape corresponding to the pixel region. The pixel electrode PXL is formed to have a plurality of segments. Especially, the pixel electrode PXL is vertically overlapped with the common electrode COM with the second passivation layer PA2 there-between. Between the pixel electrode PXL and the common electrode COM, the fringe electric field is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel region may be changed so as to represent desired gray scale.

In addition, for using a large current driving method in the active matrix type organic light emitting diode display, the thin film transistor substrate including a method oxide semiconductor material is increasingly required. For the organic light emitting diode display, referring to FIG. 2, an anode electrode (not shown) instead of the common electrode COM is formed as to be connected to the drain electrode D on the planar layer PAC, and an organic light emitting diode may be completed on the anode electrode. The structure of the thin film transistor T, the driving element, is commonly used for various type of flat panel display.

Nowadays, the thin film transistor substrate including a plurality of thin film transistor having the metal oxide semiconductor is mainly used in the flat panel display. As mentioned above, as the metal oxide semiconductor material is very weak against the developers, etchants and/or strip solutions used for the photo-lithography process, the semiconductor layer would be preferably protected by an etch stopper. Due to this structure, there may be various problems.

Hereinafter, one of the important problems caused in the thin film transistor substrate having the oxide semiconductor according to the related art will be explained. FIG. 3 is an enlarged cross-sectional view of circled portion ① in FIG. 2 for illustrating the structure of the thin film transistor having the oxide semiconductor material according to the related art.

On the gate insulating layer GI, depositing a metal oxide semiconductor material such as the Indium Gallium Zinc Oxide (IGZO) and patterning it in a mask process, a semiconductor layer A overlapped with the gate electrode G. Depositing an inorganic insulating material on the semiconductor layer A and patterning it with another mask process, an etch stopper ES covering some portions of the semiconductor layer A is formed. Then, depositing a source metal material and patterning it with yet another mask process, a source electrode S contacting the one exposed side of the semiconductor layer A from the etch stopper ES and a drain electrode D contacting the other exposed side of the semiconductor layer A from the etch stopper ES are formed.

During performing these 3 mask processes, the mask alignment clearance should be considered. That is, the etch stopper ES should have the length longer than the channel length plus at least the mask alignment clearance. Further, some portions of the source electrode S and the drain electrode D would be overlapped with the etch stopper ES. Here, we defined and/or called the overlapped portion between the source-drain electrodes S and D and the etch stopper ES as the overlapping area OVL.

In the thin film transistor having the metal oxide semiconductor material, this overlapping area OVL is one of main cause for degrading the characteristics of the thin film transistor. For example, in the organic light emitting diode display, the luminance would be controlled at the saturation area of the thin film transistor, when driving the organic light emitting diode of the organic light emitting diode display. In this case, if the saturation characteristics of the thin film transistor are not guaranteed, this may cause the luminance failure or distortion. In order to guarantee the saturation characteristics of the oxide thin film transistor, it is preferable for the size of the overlapping area OVL to be less than 1 µm (micrometer). However, it is very hard to make a large area thin film transistor substrate in which all thin film transistors have almost similar size of the overlapping area OVL.

Therefore, for developing, designing and mass producing the thin film transistor substrate having the oxide semiconductor material, it is required to ensure the technology in which the overlapping area would be minimized and/or eliminated, and all thin film transistors have the similar channel length.

SUMMARY OF THE INVENTION

In order to overcome and address the above mentioned drawbacks and other limitations, the present invention provides a thin film transistor substrate including a method oxide semiconductor material in which the channel length between the source and drain electrodes is optimized, and a method for manufacturing the same. Another purpose of the present invention is to suggest a thin film transistor substrate including a method oxide semiconductor material in which there is no any insulating layer such as the etch stopper between the semiconductor layer and the source-drain electrodes and there is no overlapping area between them, and a method for manufacturing the same.

In order to accomplish the above purpose, one embodiment of the present invention suggests a thin film transistor substrate comprising: a gate electrode on a substrate; a gate insulating layer covering the gate electrode; a source electrode overlapping with one side of the gate electrode on the gate insulating layer; a drain electrode being apart from the source electrode and overlapping with other side of the gate electrode on the gate insulating layer; an oxide semiconductor layer contacting an upper surface of the source electrode and the drain electrode, and extending from the source electrode to the drain electrode; and an etch stopper having the same shape with the oxide semiconductor layer, and contacting an upper surface of the oxide semiconductor layer.

In some embodiments, the source electrode and the drain electrode includes: a first metal layer; and a second metal layer stacked on the first metal layer, wherein the first metal layer has a tail extruded from outsides of the second metal layer; and wherein the oxide semiconductor layer contacts an upper surface and an etched side surface of the second metal layer, and an upper surface and an etched side surface of the tail.

In some embodiments, the first metal layer includes at least one of molybdenum and titanium, and the second metal layer includes a low resistance metal material having copper and aluminum.

In some embodiments, the source electrode and the drain electrode further includes a third metal layer stacked on the second metal layer, and the oxide semiconductor layer contacts an upper surface and an etched side surface of the third metal layer, an etched side of the second metal layer, and an upper surface and an etched side surface of the tail.

In some embodiments, the oxide semiconductor layer includes a metal oxide semiconductor material having Indium Gallium Zinc Oxide.

In some embodiments, the oxide semiconductor layer and the etch stopper have the same shape and size with a source-drain elements including the source electrode and the drain electrode.

Further, one embodiment of the present invention suggests a method for manufacturing a thin film transistor substrate comprising: a first mask process for forming a gate electrode on a substrate; a step for forming a gate insulating layer covering the gate electrode; a second mask process for forming a source electrode overlapping with one side of the gate electrode, and a drain electrode overlapping with other side of the gate electrode and being apart from the source electrode, on the gate insulating layer; and a third mask process for forming an oxide semiconductor layer extending from the source electrode to the drain electrode, and an etch stopper having the same shape and size with the oxide semiconductor layer on the oxide semiconductor layer.

In some embodiments, the second mask process comprises steps for: depositing a source-drain metal layer on the gate insulating layer; depositing a photoresist on the source-drain metal layer; patterning the photoresist having a first thickness on a source-drain element including the source electrode and the drain electrode, and a second thickness thinner than the first thickness on a space between the source electrode and the drain electrode, using a half-tone mask; forming a source-drain photoresist pattern by thinning the photoresist until the photoresist of the second thickness is eliminated; patterning the source-drain metal layer with the source-drain photoresist pattern as a mask; and removing the source-drain photoresist pattern.

In some embodiments, the third mask process comprises steps for: depositing an oxide semiconductor material on the patterned source-drain element; depositing an inorganic insulating material on the oxide semiconductor material; depositing a photoresist on the inorganic insulating material; patterning the photoresist using the half-tone mask; patterning the inorganic insulating layer and the oxide semiconductor material using the patterned photoresist as a mask; and removing the patterned photoresist.

According to the present invention, the thin film transistor substrate having the oxide semiconductor material has a channel area defined precisely and uniformly over the whole surface of the substrate, by forming the source-drain electrode firstly and then forming a semiconductor layer thereon. The present disclosure has a merit for suggesting a thin film transistor substrate in which the characteristics of all thin film transistors are can be optimized and stabilized over whole substrate. Further, forming a tail at under portion of the source-drain electrode using a half-tone mask process, the channel layer makes good ohmic contact property with the source-drain electrodes. In addition, using the same one half-tone mask at forming the source-drain electrode and at forming the semiconductor layer, the present disclosure suggests a method for manufacturing the thin film transistor substrate with low cost.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
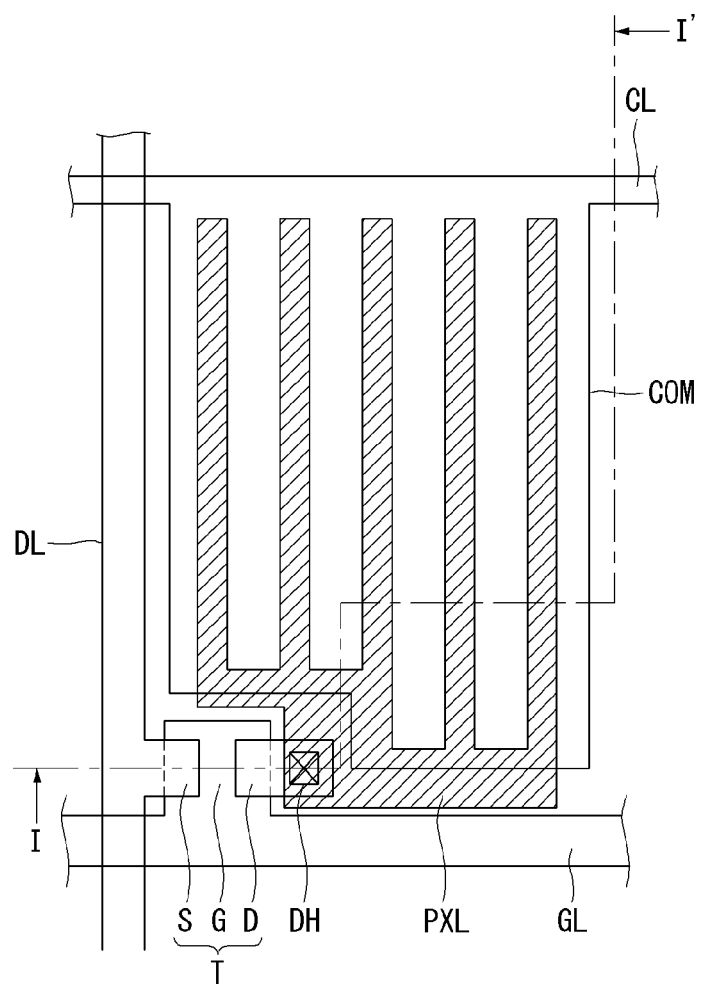
FIG. 1 is a plane view illustrating a thin film transistor substrate having an oxide semiconductor layer included in a fringe field type liquid crystal display according to the related art.
Figure 2:
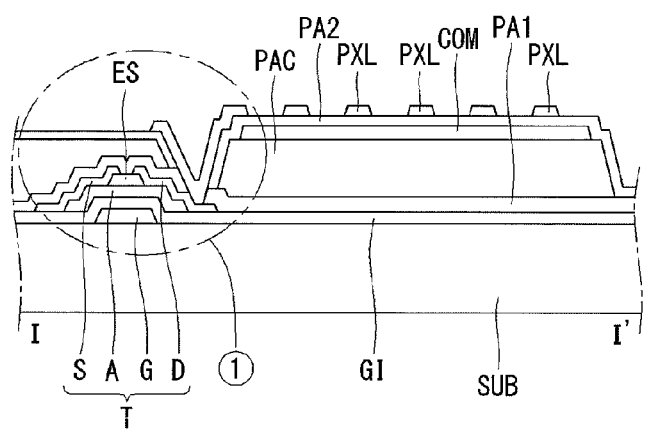
FIG. 2 is a cross-sectional view illustrating the structure of the thin film transistor substrate of FIG. 1 along the line I-I' according to the related art.
Figure 3:
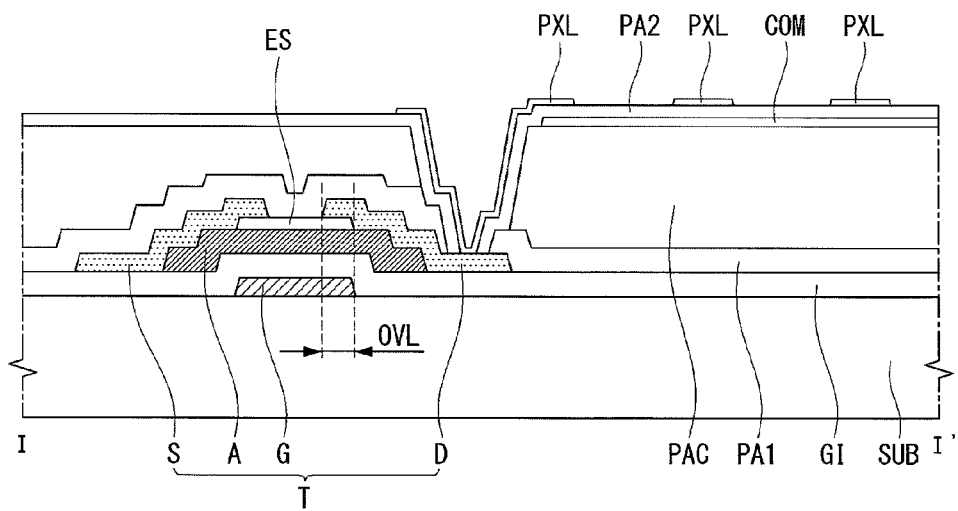
FIG. 3 is an enlarged cross-sectional view of circled portion ① in FIG. 2 for illustrating the structure of the thin film transistor having the oxide semiconductor material according to the related art.

Referring to attached figures, preferred embodiments of the present invention will be described. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

Figure 4:
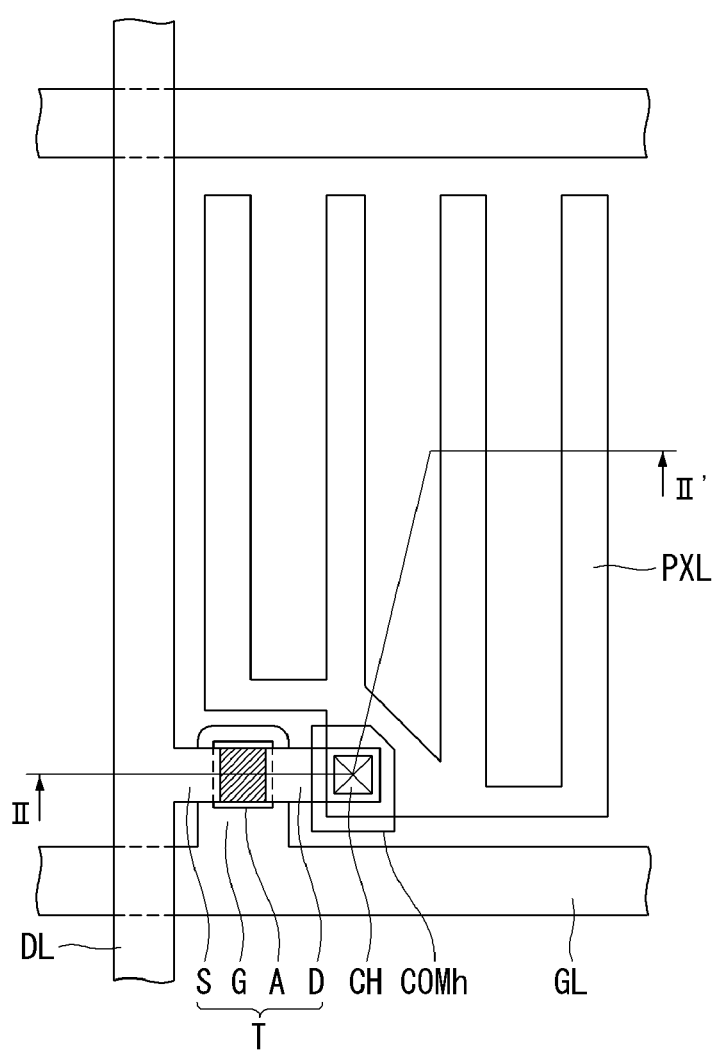
FIG. 4 is a plane view illustrating a thin film transistor substrate having an oxide semiconductor layer included in a fringe field type liquid crystal display according to a first embodiment of the present invention.
Figure 5:
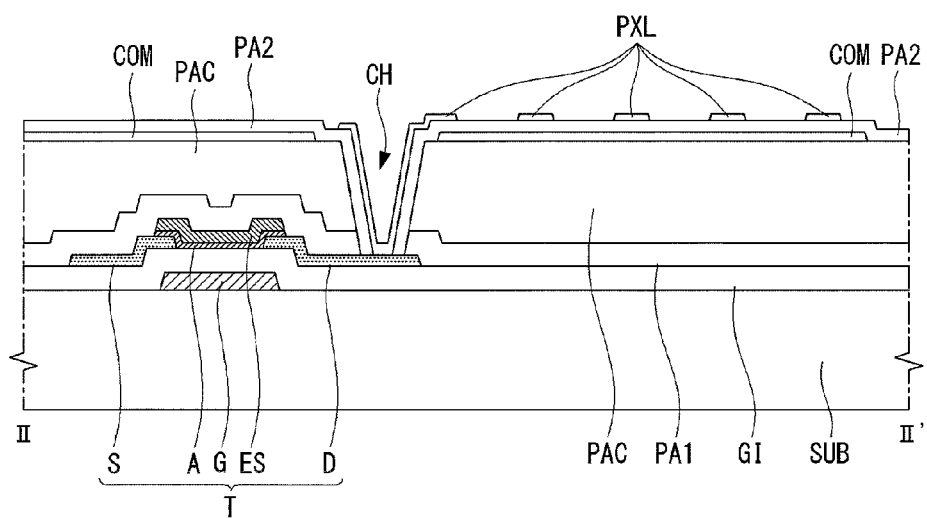
FIG. 5 is a cross-sectional view along the cutting line II-IF in FIG. 4 for illustrating the structure of the fringe field type thin film transistor having an oxide semiconductor layer according to the first embodiment of the present invention.

Referring to FIGS. 4 and 5, the first embodiment of the present disclosure will be explained. In convenience the thin film transistor substrate for the liquid crystal display will be explained. However, it can be applied to the thin film transistor substrate for the organic light emitting diode display. FIG. 4 is a plane view illustrating a thin film transistor substrate having an oxide semiconductor layer included in a fringe field type liquid crystal display according to the first embodiment of the present disclosure. FIG. 5 is a cross-sectional view along the cutting line II-IF in FIG. 4 for illustrating the structure of the fringe field type thin film transistor having an oxide semiconductor layer according to the first embodiment of the present disclosure.

Referring to FIGS. 4 and 5, the thin film transistor substrate having an oxide semiconductor layer according to the present disclosure comprises a gate line GL and a data line DL crossing each other with a gate insulating layer GI there-between on a lower substrate SUB, and a thin film transistor T formed each pixel region defined by the crossing structure of the gate line GL and the data line DL.

The thin film transistor T comprises a gate electrode G branching out from the gate line GL, a source electrode S branching from the data line DL, a drain electrode D facing with the source electrode S, and a semiconductor layer A overlapping with the gate electrode G and including a channel area between the source electrode S and the drain electrode D.

In the present disclosure, the source electrode S and the drain electrode D are firstly formed on the gate insulating layer GI covering the gate electrode G. The source electrode S and the drain electrode D are facing each other with a predetermined distance and some portions of them are overlapping with the gate electrode G, respectively.

On the source electrode S and the drain electrode D, a semiconductor layer A is formed. Particularly, in the case that the semiconductor layer A includes an oxide semiconductor material such as the Indium Gallium Zinc Oxide, thanks to the high carrier mobility, it has many merits for the large area thin film transistor substrate in which the large capacitance is required. The semiconductor layer A contacts the upper some portions of the source electrode S and the drain electrode D, respectively. Further, it covers the middle portions of the gate electrode G, as expanding from the source electrode S to the drain electrode D. The distance from the source electrode S and the drain electrode D would define the length of the channel area. In this structure, when patterning the source-drain electrodes S and D, the channel area would be defined. As the source-drain electrodes S and D are contacting the semiconductor layer A directly, the channel area can be exactly and precisely defined. Further, all channel areas disposed on the whole substrate have almost same lengths.

If required, an etch stopper ES may be formed over the semiconductor layer A having the same size and shape with the semiconductor layer A. In that case, the etch stopper ES can protect the semiconductor layer A from the developer, the etchant and/or the stripper during the photo-lithography process. Further, in that case, the etch stopper ES is not overlapped with any portion of the source-drain electrodes S and D. Therefore, the characteristics of the semiconductor layer A, especially the channel area, would be maintained in a stable condition.

Like this, as the source-drain electrodes S and D are firstly formed and then the semiconductor layer A having the metal oxide semiconductor material is stacked thereon, the thin film transistor T is completed. On the whole surface of the substrate SUB having the thin film transistor T, a first passivation layer PA1 is deposited.

In the pixel region, a pixel electrode PXL and a common electrode COM are disposed in which they are overlapped with a second passivation layer PA2 therebetween. The common electrode COM is connected to the common line CL disposed on the substrate SUB as being parallel with the gate line GL. The common electrode COM is supplied with a reference voltage (or common voltage) from the common line CL.

While the common electrode COM is supplied with a reference voltage having constant value, the pixel electrode PXL is supplied with a data voltage varying timely according to the video data. As a result, between the data line DL and the pixel electrode PXL, a parasitic capacitance may be formed. Due to the parasitic capacitance, the video quality of the display may be degraded. Therefore, it is preferable to form the common electrode COM at first and then the pixel electrode PXL is formed at the topmost layer.

To do so, on the first passivation layer PA1 covering the data line DL and the thin film transistor T, a planar layer PAC formed by thickly depositing an organic material having a low permittivity. Then, the common electrode COM is formed on the planar layer PAC. The common electrode COM may have the shape as covering the almost surface of the substrate SUB excepting the thin film transistor T. Otherwise the common electrode COM may cover the almost surface of the substrate SUB excepting the certain area COMh including contact hole CH for exposing some portions of the drain electrode D.

After depositing the second passivation layer PA2 covering the common electrode COM, the pixel electrode PXL overlapping with the common electrode COM is formed on the second passivation layer PAS2. In this structure, as the pixel electrode PXL is disposed far from the data line DL by the first passivation layer PA1, the planar layer PAC and the second passivation layer PA2, the parasitic capacitances can be reduced or minimized.

A contact hole CH exposing some portions of the drain electrode D is formed by penetrating the second passivation layer PA2, the planar layer PAC and the first passivation layer PA1. On the second passivation layer PA2, a pixel electrode PXL is formed as being contacting the drain electrode D through the contact hole CH. The pixel electrode PXL may have a plurality of segments being disposed in parallel each other. Especially, the pixel electrode PXL is vertically overlapped with the common electrode COM with the second passivation layer PAS therebetween.

By this fringe electric field between the pixel electrode PXL and the common electrode COM, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel region may be changed so as to represent desired gray scale.

In the thin film transistor substrate according to the first embodiment of the present disclosure, the oxide semiconductor layer A is deposited with the thickness of about 600 Å. In the case that the source-drain electrodes S and D are made of low resistance metal material such as copper or aluminum, these electrodes may be peeled off due to the bad surface contact between the copper and the IGZO. This may cause the unstable ohmic contact between the source-drain electrodes S and D and the semiconductor layer A.

Figure 6:
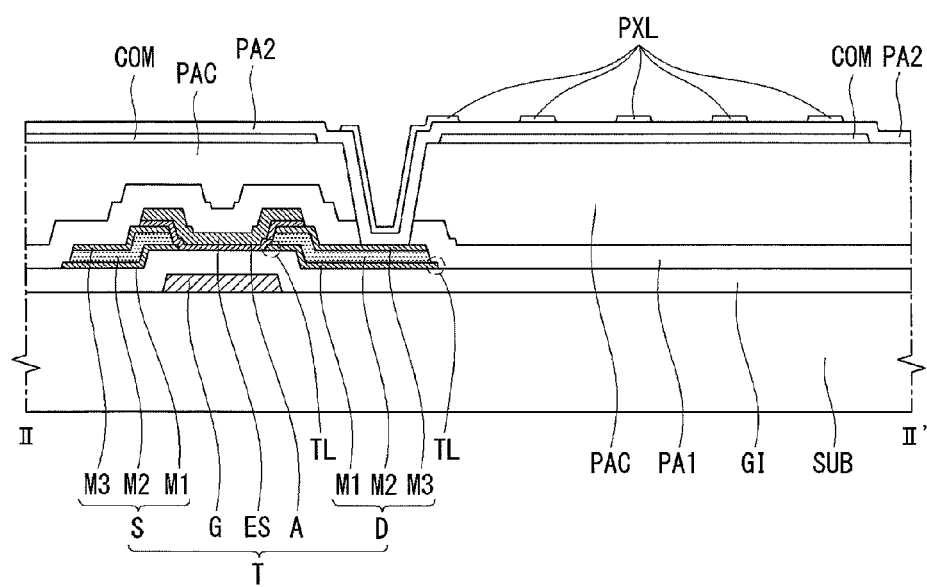
FIG. 6 is a cross-sectional view along the cutting line II-IF in FIG. 4 for illustrating the structure of the fringe field type thin film transistor having an oxide semiconductor layer according to a second embodiment of the present invention.

As a method for addressing or minimizing the above-mentioned limitation associated with the first embodiment, referring to FIGS. 4 and 6, the second embodiment of the present disclosure will be explained. For the structure of plane view, the thin film transistor substrate according to the second embodiment is similar with that of the first embodiment. Therefore, FIG. 4 will be used as the plane view. For explaining differences, FIG. 6 shows the cross-sectional structure of the second embodiment. FIG. 6 is a cross-sectional view along the cutting line II-IF in FIG. 4 for illustrating the structure of the fringe field type thin film transistor having an oxide semiconductor layer according to the second embodiment of the present disclosure.

Comparing FIG. 6 showing the structure of the thin film transistor according to the second embodiment with the FIG. 5 showing that of the first embodiment, one of main differences is on the structure and formation of the source-drain electrodes S and D.

The source-drain electrodes S and D have the three-layered structure. For example, the source-drain electrodes S and D include a first metal layer M1, a second metal layer M2 and a third metal layer M3, stacked sequentially. For the second metal layer M2 may include a low resistance metal material such as copper or aluminum used for line material. In the interim, the first metal layer M1 and the third metal layer M3 may include a protective metal material such as molybdenum (Mo), titanium (Ti) or molybdenum-titanium alloy (MoTi) for ensuring the surface contact property with other material layer and reinforcing the anti-corrosion property and/or the anti-chemistry property.

Particularly, the first metal layer M1 disposed at the lowest layer preferably has the same shape with other metal layers M2 and M3 but larger size than them. That is, the first metal layer M1 includes a tail TL (or, extruded portion) to the lateral sides from the second metal layer M2.

Disposed on the second metal layer M2, the third metal layer M3 can prevent the second metal layer M2 when patterning the semiconductor layer A and/or the etch stopper ES. Further, the third metal layer M3 preferably has superior interface property with the metal oxide semiconductor material than the second metal layer M2.

Due to the first metal layer M1 and the third metal layer M3, the semiconductor layer A having the metal oxide semiconductor material has an enough contact area with the source-drain electrodes S and D, and maintains better ohmic contact condition with them.

In order to form the first metal layer M1 as having the tail TL, modifying the components (materials or composition ratio) of the etchant or controlling the etching time intervals during the etching process, the second metal layer M2 may be formed as being overetched than the first metal layer M1. Otherwise, by performing the photo-resist ashing step in a half-tone mask process, the first metal layer M1 may be formed as having the tail TL.

Figure 7:
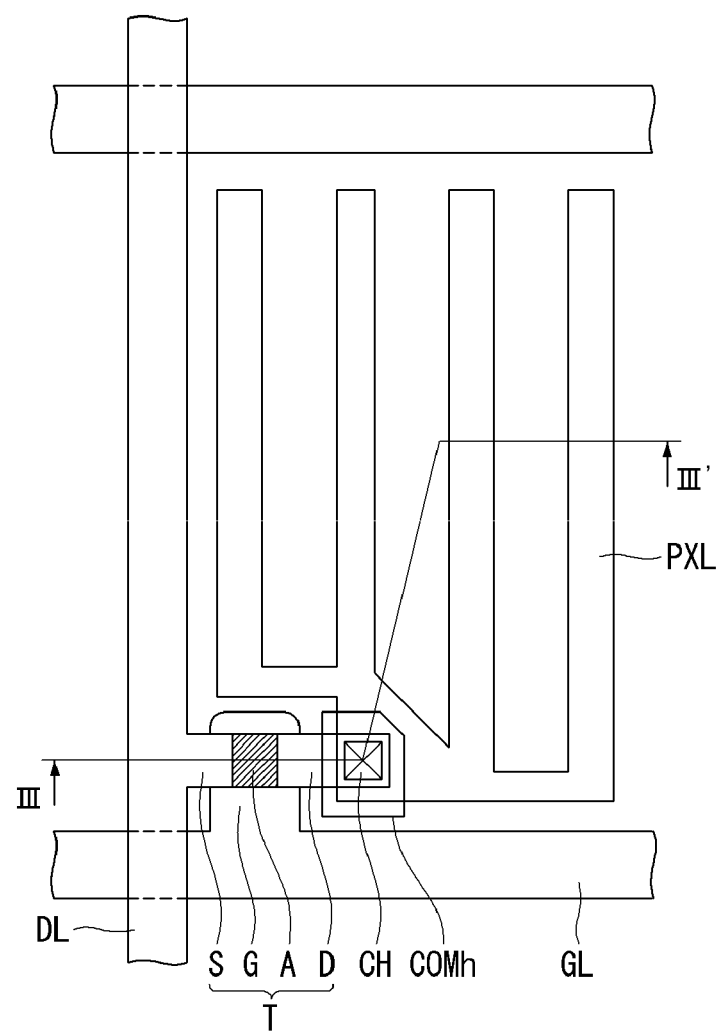
FIG. 7 is a plane view illustrating a thin film transistor substrate having an oxide semiconductor layer included in a fringe field type liquid crystal display according to a third embodiment of the present invention.
Figure 8:
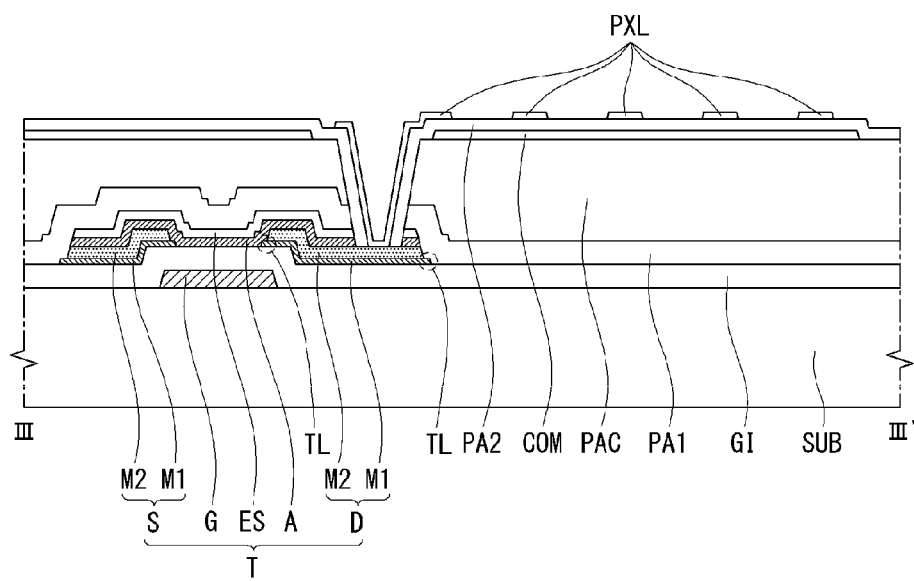
FIG. 8 is a cross-sectional view along the cutting line III-III' in FIG. 7 for illustrating the structure of the fringe field type thin film transistor having an oxide semiconductor layer according to the third embodiment of the present invention.

Hereinafter, referring to FIGS. 7 and 8, the third embodiment of the present disclosure will be explained. In the third embodiment, the present invention suggests a structure of the thin film transistor substrate in which the purpose in the second embodiment can be accomplished easier and simpler than the second embodiment. FIG. 7 is a plane view illustrating a thin film transistor substrate having an oxide semiconductor layer included in a fringe field type liquid crystal display according to the third embodiment of the present disclosure. FIG. 8 is a cross-sectional view along the cutting line III-III' in FIG. 7 for illustrating the structure of the fringe field type thin film transistor having an oxide semiconductor layer according to the third embodiment of the present disclosure.

At first, comparing FIG. 8 showing the structure of the thin film transistor according to the third embodiment with FIG. 5 showing that of the first embodiment, the main differences are on the structure and formation of the source-drain electrodes S and D and the structure and formation of the semiconductor layer A and the etch stopper ES.

The source-drain electrodes S and D are formed as being two layered structure. For example, the source-drain electrodes S and D have a first metal layer M1 and a second metal layer M2 stacked sequentially. For the second metal layer M2 may include a low resistance metal material such as copper or aluminum used for line material. In the interim, the first metal layer M1 may include a protective metal material such as molybdenum (Mo), titanium (Ti) or molybdenum-titanium alloy (MoTi) for ensuring the surface contact property with other material layer and reinforcing the anti-corrosion property and/or the anti-chemistry property.

Particularly, the first metal layer M1 disposed at the lowest layer preferably has the same shape with other metal layers M2 and M3 but larger size than them. That is, the first metal layer M1 includes a tail TL (or, extruded portion) to the lateral sides from the second metal layer M2. The semiconductor layer A deposited thereon covers on the source-drain electrodes S and D along the step shape formed at the circumstance of the source-drain electrodes S and D. As a result, the semiconductor layer A may make a good ohmic contact property with the source-drain electrodes S and D.

According to the third embodiment, the semiconductor layer A and the etch stopper ES have the same outer shape with the source-drain electrode S-D. That is, the semiconductor layer A covers and contacts the whole upper surface of the source-drain electrodes S and D. As the result, the interface contact property between the semiconductor layer A and the source-drain electrodes S and D may be enhanced.

Like this, in order to form the semiconductor layer A as having the same outer shape with the source-drain electrodes S and D, in the third embodiment, the same mask would be used. Especially, in order to form the tail TL at the first metal layer M1, it is preferable to use a half-tone mask. Hereinafter, referring to FIGS. 9A to 9K, the method for manufacturing the thin film transistor substrate according to the third embodiment will be explained. FIGS. 9A to 9K are cross-sectional views along the cutting line III-III' in FIG. 7 for illustrating the method for manufacturing the fringe field type thin film transistor having an oxide semiconductor layer according to the third embodiment of the present disclosure.

Figure 9A:
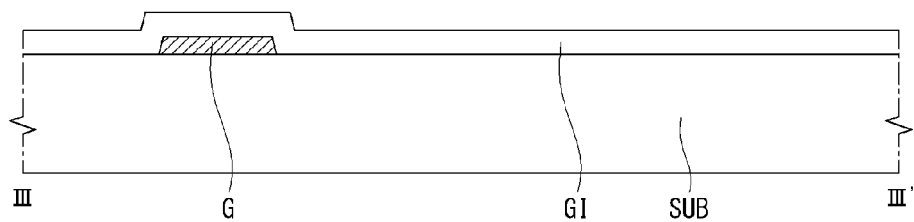
FIGS. 9A to 9K are cross-sectional views along the cutting line III-III' in FIG. 7 for illustrating the method for manufacturing the fringe field type thin film transistor having an oxide semiconductor layer according to the third embodiment of the present invention.

As shown in FIG. 9A, on the transparent substrate SUB such as a glass, a gate metal material is deposited. Patterning the gate metal material using a first mask process, gate elements are formed. The gate elements include a gate line GL extending to a first direction on the substrate SUB, and a gate electrode G branching from the gate line GL. On the substrate SUB having the gate elements, a gate insulating layer GI is formed.

On the gate insulating layer GI, a first metal layer M1 and a second metal layer M2 are deposited sequentially. Patterning them using a second mask process, source-drain elements are formed. The first metal layer M1 includes molybdenum (Mo) and/or titanium (Ti). The second metal layer M2 includes a low resistance metal material such as copper (Cu) and/or aluminum (Al). In the third embodiment, one of main features is on the second mask process for forming the source-drain elements. Hereinafter, the second mask process will be explained in detail.

Figure 9B:
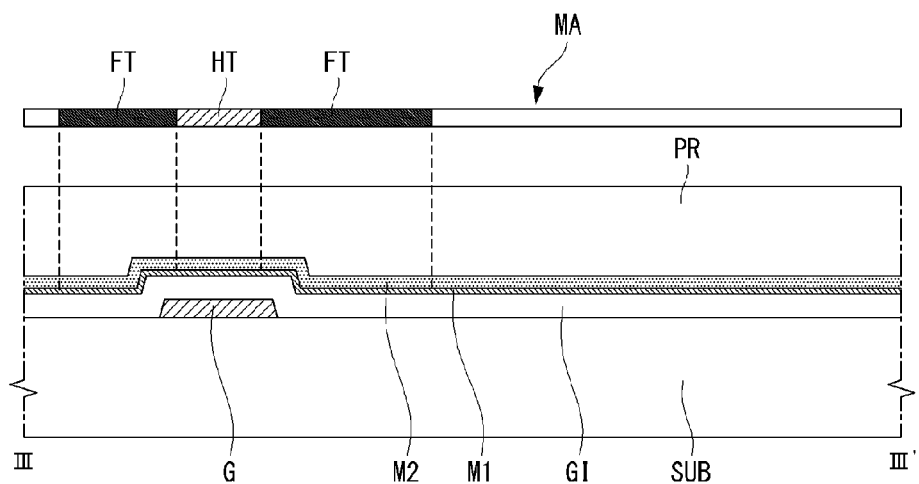

As shown in FIG. 9B, on the second metal layer M2, a photoresist PR is deposited. Using a half-tone mask MA, the exposure process is performed on the photoresist PR. For example, the half-tone mask MA includes a full tone portion FT where the light would be perfectly blocked and a half tone portion HT where some portions of the light, i.e., 40~60% of the light, would be transmitted. Further, a full exposed portion where the full intensity of light is transmitted is included for other portions of area. Here, the full tone portion FT has a shape corresponding to the shape of the source-drain elements. The half tone portion HT has a shape corresponding to the channel area in the semiconductor layer A. The half tone portion HT is disposed between the source electrode S and the drain electrode D.

Figure 9C:
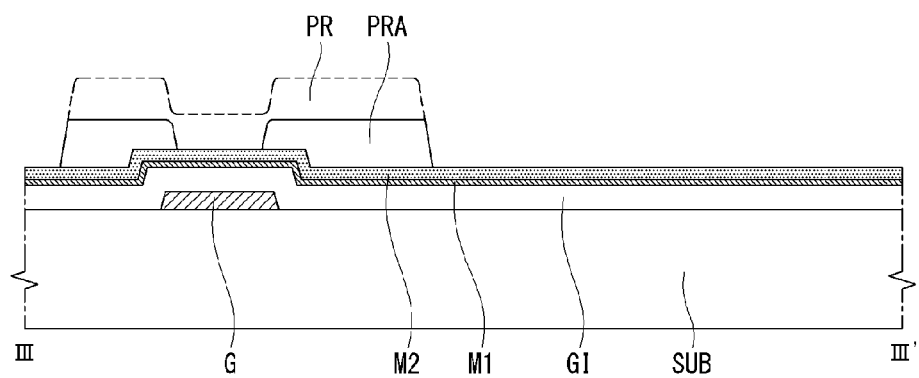

As shown in FIG. 9C, a developing process is conducted to the photoresist PR exposed using the half-ton mask MA. As the result, the photoresist may be formed as having a first thickness at the full tone portion FT and a second thickness thinner than the first thickness at the half-ton portion HT. Further, photoresist PR at the other area would be eliminated. After that, an ashing process is conducted to the photoresist PR until the photoresist PR is thinned as the second thickness of the photoresist PR is removed. As the result, only at the full tone portion FT, the photoresist PRA is remained.

Figure 9D:
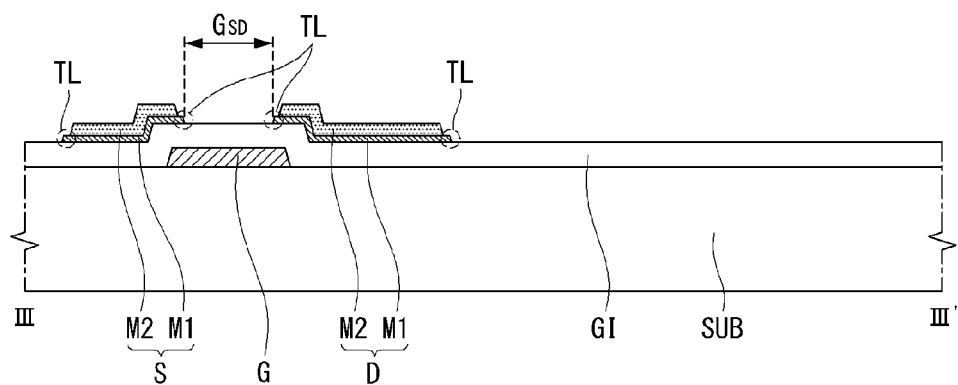

After ashing, using the remained photoresist PRA on the second metal layer M2, the second metal layer M2 and the first metal layer M1 are sequentially etched to form the source-drain elements. The source-drain elements include a data line DL extending to a second direction, a source electrode S branching from the data line DL, and a drain electrode D facing to the source electrode S with a predetermined distance apart. In addition, the first metal layer M1 of the source-drain elements has a tail TL extruded to outer side from the second metal layer M2. The source-drain gap GSD, the distance between the source electrode S and the drain electrode D, may be defined by the distance formed by the depart portions of the first metal layer M1, as shown in FIG. 9D.

On the substrate SUB having the source-drain elements, a metal oxide semiconductor material OSE such as the Indium Gallium Zinc Oxide, and an inorganic insulating material INM such as the silicon oxide (SiOx) or silicon nitride (SiNx) are sequentially deposited. Patterning them using a third mask process, a semiconductor layer A and an etch stopper ES are formed. In the third embodiment, one of main features is also on the third mask process. Hereinafter, the second mask process will be explained in detail.

Figure 9E:
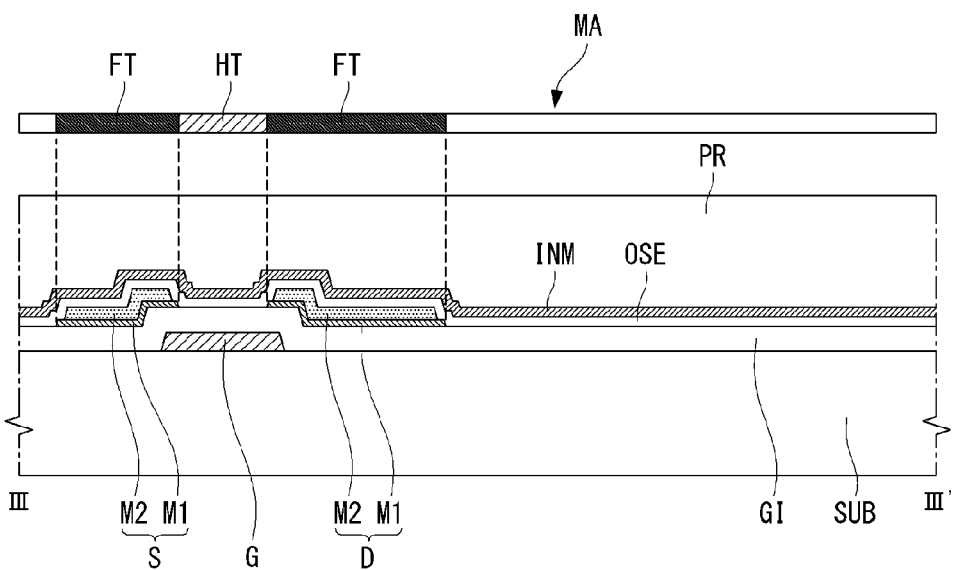

As shown in FIG. 9E, on the inorganic insulating material INM, a photoresist PR is deposited. Using the same half-tone mask MA used for the source-drain elements, the exposure process is conducted on the photoresist PR. That is the same mask for source-drain elements is used again and the same exposure process with the same condition is used.

Figure 9F:
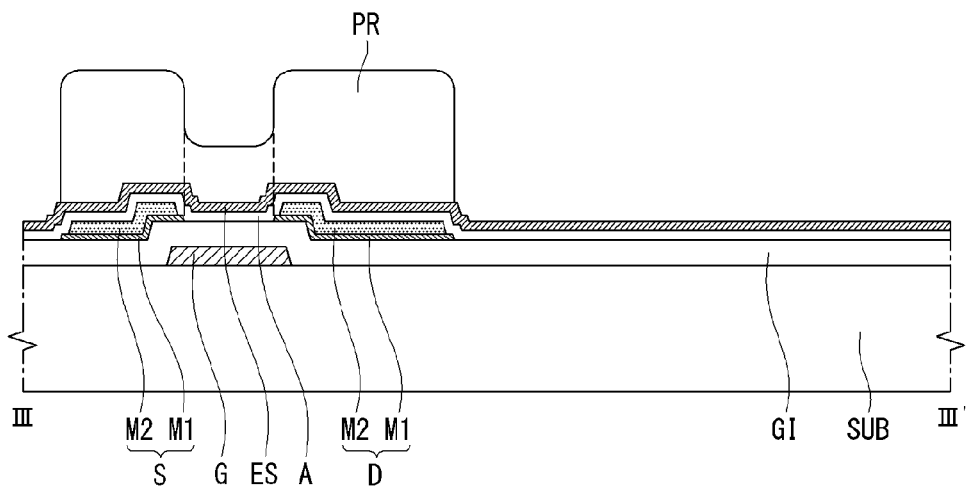

After that, conducting a developing process, the photoresist is remained on a full tone portion FT and a half tone portion HT have PR. For example, on the inorganic insulating material INM, the photoresist PR is formed as having a first thickness at the full tone portion and a second thickness thinner than the first thickness at the half tone portion. On the other portions, there is no photoresist, as shown in FIG. 9F.

Figure 9G:
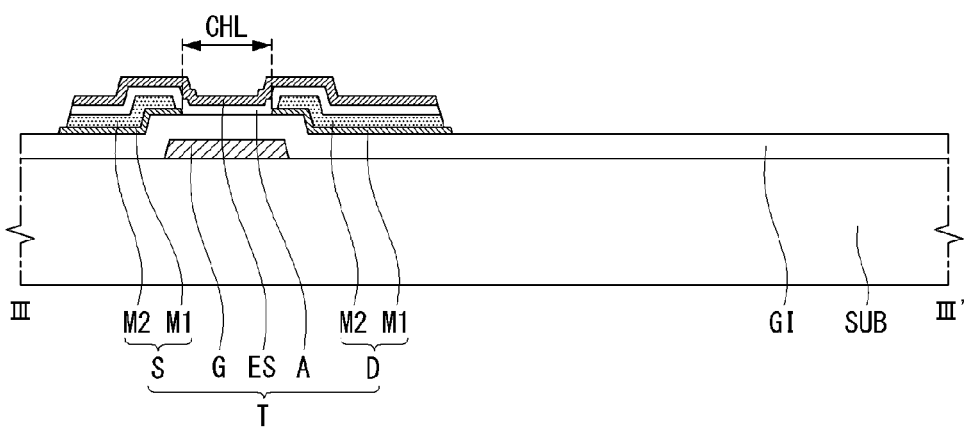

Using the patterned photoresist PR as a mask, the inorganic insulating material INM and the metal oxide semiconductor material OSE are sequentially patterned to form the etch stopper ES and the semiconductor layer A. The semiconductor layer A contacts all upper surfaces of the source electrode S and the drain electrode D and overlaps with the gate electrode G disposed between the source electrode S and the drain electrode D. As the result, the source-drain gap GSD, the distance between the source electrode S and the drain electrode D, defines the channel length CHL. Especially, as the same mask is used for forming the source-drain element and for forming the etch stopper ES and the semiconductor layer A, the etch stopper ES and the semiconductor layer A has a shape as stacking on the source-drain elements, as shown in FIG. 9G.

Figure 9H:
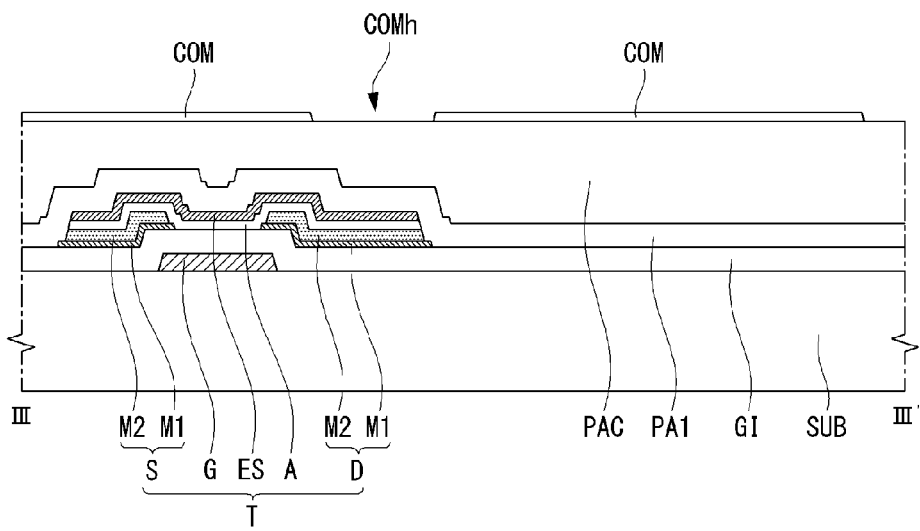

Now, the thin film transistor T is completed. On the substrate SUB having the thin film transistor T, a first passivation layer PA1 and a planar layer PAC are deposited. On the planar layer PAC, a transparent conductive material such as the Indium Tin Oxide (ITO) or the Indium Zinc Oxide (IZO) is deposited. Patterning it with a fourth mask, a common electrode COM is formed. It is preferable that the common electrode COM has a shape covering all most of the surface of the substrate SUB excepting some area COMh including the contact hole CH for connecting the pixel electrode PXL and the drain electrode D, as shown in FIG. 9H.

Figure 9I:
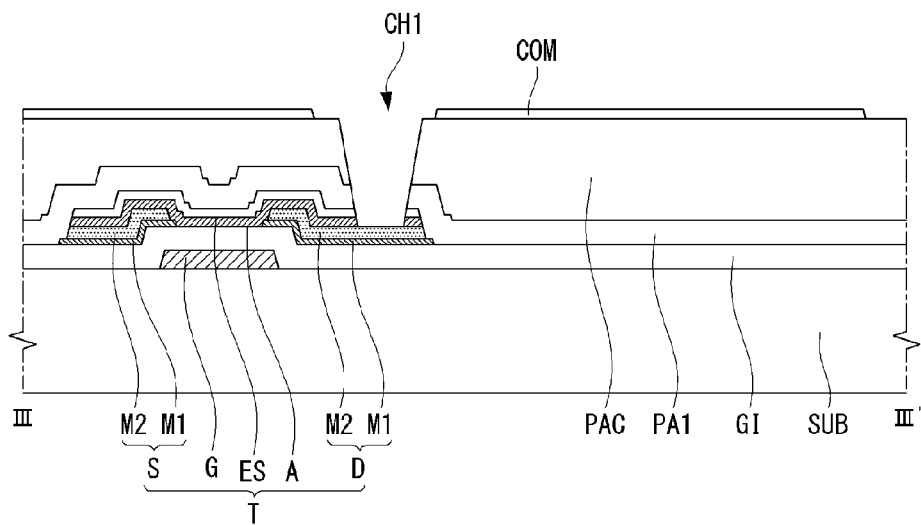

With a fifth mask process, some portions of the planar layer PAC, the first passivation layer PA1, the etch stopper ES and the semiconductor layer A are etched. As the result, a first contact hole CH1 exposing some portions of the drain electrode D is formed, as shown in FIG. 9I.

Figure 9J:
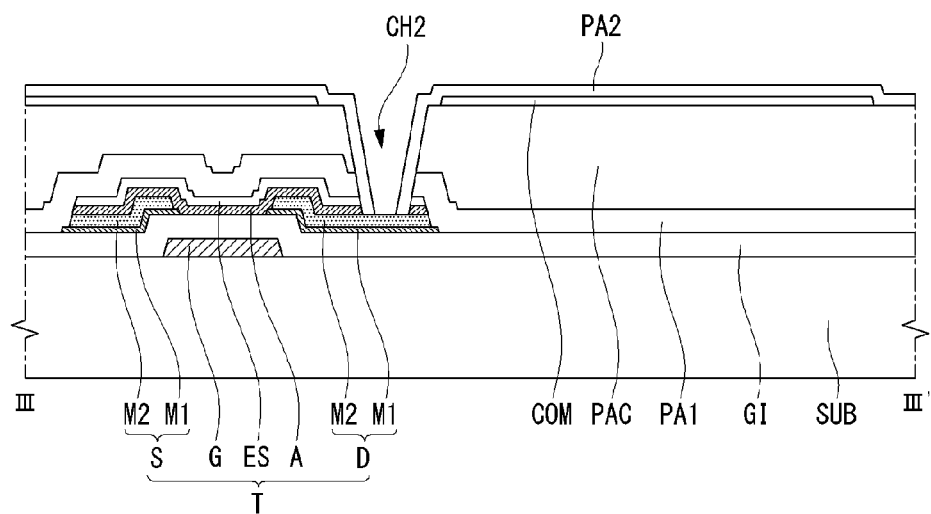

Depositing an inorganic insulating material on the whole surface of the substrate SUB having the common electrode COM, a second passivation layer PA2 is formed. Patterning the second passivation layer PA2 with a sixth mask process, a second contact hole CH2 exposing some portions of the drain electrode D is formed. It is preferable that the second contact hole CH2 is included into the first contact hole CH1, as shown in FIG. 9J.

Figure 9K:
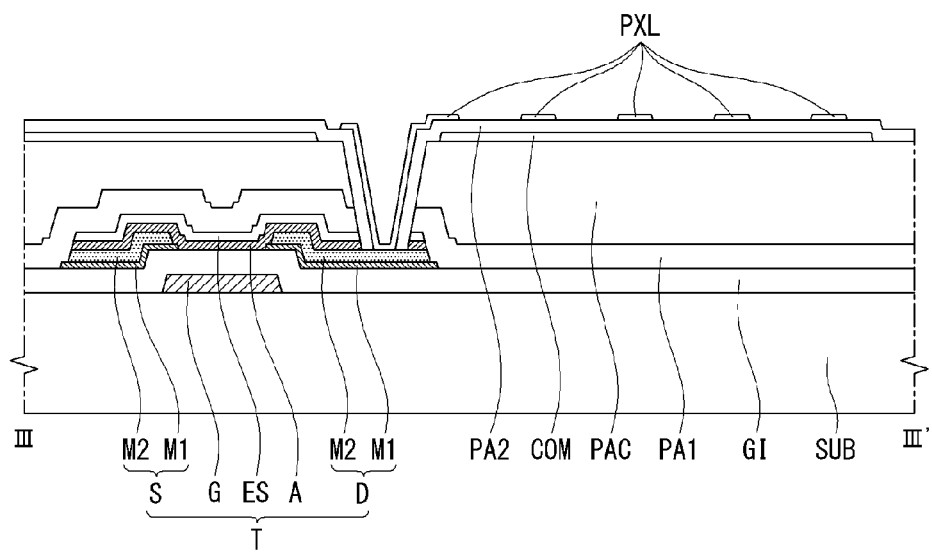

Depositing a transparent conductive material on the second passivation layer PA2 and patterning it with a seventh mask process, the pixel area PXL is formed. For the case of the fringe field type liquid crystal display, the pixel electrode PXL may have a plurality of segments overlapping with the common electrode COM, as shown in FIG. 9K.

Even though it is not showing in figures, the sixth mask process may be included in the fifth mask process. For example, after forming the common electrode COM with the fourth mask process, the second passivation layer PA2 may be directly deposited without forming the first contact hole CHL. Then, patterning some portions of the second passivation layer PA2, the planar layer PAC, the first passivation layer PA1, the etch stopper ES and the semiconductor layer A over the drain electrode D with the fifth mask process, a contact hole CH exposing some portions of the drain electrode D may be formed.

The method for manufacturing the thin film transistor substrate having the metal oxide semiconductor material according to the third embodiment have a merit for saving the cost for the mask process by using one same mask in two different mask processes. In addition, using the half-tone mask, the number of mask process may be reduced also. Even further, using the half-tone mask process, the lower metal layer of the source-drain elements has the tail TL, easily and precisely. As the source-drain element has the same shape and size with the semiconductor layer A, the semiconductor layer A makes an ohmic contact with the source-drain elements.

While the embodiments of the present invention have been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A thin film transistor substrate, comprising:
   a gate electrode on a substrate;
   a gate insulating layer covering the gate electrode;
   a source electrode overlapping with one side of the gate electrode on the gate insulating layer;
   a drain electrode being apart from the source electrode and overlapping with other side of the gate electrode on the gate insulating layer;
   an oxide semiconductor layer contacting an upper surface of the source electrode and the drain electrode, and extending from the source electrode to the drain electrode; and
   an etch stopper having the same shape as the oxide semiconductor layer and aligned and corresponding to each other, and contacting an upper surface of the oxide semiconductor layer,
   wherein the source electrode and the drain electrode include:
   a first metal layer,
   a second metal layer stacked on the first metal layer, wherein the first metal layer has a tail extending from beyond side surfaces of the second metal layer, and
   wherein the oxide semiconductor layer directly contacts an upper surface and an etched side surface of the first and second metal layers, and an upper surface and an etched side surface of the tail.

2. The thin film transistor substrate according to claim 1, wherein the first metal layer includes at least one of molybdenum and titanium, and
   wherein the second metal layer includes a low resistance metal material having copper and aluminum.

3. The thin film transistor substrate according to claim 1, wherein the source electrode and the drain electrode further include a third metal layer stacked on the second metal layer, and
   wherein the oxide semiconductor layer contacts an upper surface and an etched side surface of the third metal layer, an etched side of the second metal layer, and an upper surface and an etched side surface of the tail.

4. The thin film transistor substrate according to claim 1, wherein the oxide semiconductor layer includes a metal oxide semiconductor material having Indium Gallium Zinc Oxide.

5. The thin film transistor substrate according to claim 1, wherein the oxide semiconductor layer and the etch stopper have the same shape and size as source-drain elements including the source electrode and the drain electrode.

* * * * *